US007844786B2

(12) United States Patent
Booth et al.

(10) Patent No.: US 7,844,786 B2
(45) Date of Patent: Nov. 30, 2010

(54) ADDRESSING AND COMMAND PROTOCOLS FOR NON-VOLATILE MEMORIES UTILIZED IN RECORDING USAGE COUNTS

(75) Inventors: James Ronald Booth, Nicholasville, KY (US); Bryan Scott Willett, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 304 days.

(21) Appl. No.: 12/107,278

(22) Filed: Apr. 22, 2008

(65) Prior Publication Data
US 2008/0276048 A1 Nov. 6, 2008

Related U.S. Application Data

(62) Division of application No. 11/154,117, filed on Jun. 16, 2005, now Pat. No. 7,426,613.

(51) Int. Cl.
G06F 12/00 (2006.01)
G06F 13/00 (2006.01)
G06F 13/28 (2006.01)

(52) U.S. Cl. .................. 711/156; 711/103; 711/148; 711/150

(58) Field of Classification Search ................ 711/156, 711/103, 148, 150
See application file for complete search history.

(56) References Cited

U.S. PATENT DOCUMENTS

| 4,586,147 | A | 4/1986 | Tadokoro |
| 4,631,428 | A | 12/1986 | Grimes |
| 4,689,740 | A | 8/1987 | Moelands et al. |
| 5,023,813 | A | 6/1991 | Brown, III |
| 5,044,790 | A | 9/1991 | Kawamura |
| 5,297,269 | A | 3/1994 | Donaldson et al. |
| 5,479,467 | A | 12/1995 | Katsumata |
| 5,689,196 | A | 11/1997 | Schutte |
| 6,002,846 | A | 12/1999 | Okamoto |
| 6,052,547 | A | 4/2000 | Cuzzo et al. |
| 6,249,838 | B1 | 6/2001 | Kon |
| 6,253,277 | B1 | 6/2001 | Lakhani et al. |
| 6,307,779 | B1 | 10/2001 | Roohparvar |
| 6,442,076 | B1 | 8/2002 | Roohparvar |
| 6,641,312 | B1 | 11/2003 | Chang et al. |
| 6,665,092 | B2 | 12/2003 | Reed |
| 6,760,274 | B2 | 7/2004 | Roohparvar |

(Continued)

OTHER PUBLICATIONS

AN10216-01 Jean-Marc Irazabal, Steve Blozis, "I2C Manual," Application Note, Philips Semiconductors, pp. 1-51, (Mar. 24, 2003).

(Continued)

*Primary Examiner*—Kevin L Ellis
*Assistant Examiner*—Ryan Bertram

(57) ABSTRACT

Electrical interfaces, addressing schemes, and command protocols allow for communications with memory modules in computing devices such as imaging and printing devices. Memory modules may be assigned an address through a set of discrete voltages. One, multiple, or all of the memory modules may be addressed with a single command, which may be an increment counter command, a write command, or a punch out bit field. The status of the memory modules may be determined by sampling a single signal that may be at a low, high, or intermediate voltage level.

16 Claims, 9 Drawing Sheets

U.S. PATENT DOCUMENTS

| | | | |
|---|---|---|---|
| 2002/0085433 A1* | 7/2002 | Tomori et al. | 365/200 |
| 2003/0011409 A1 | 1/2003 | Altrichter et al. | |
| 2003/0043408 A1 | 3/2003 | Fields et al. | |
| 2003/0133331 A1 | 7/2003 | LaBerge | |
| 2004/0133794 A1* | 7/2004 | Kocher et al. | 713/193 |
| 2004/0178278 A1 | 9/2004 | Fruhauf et al. | |
| 2005/0036620 A1 | 2/2005 | Casden et al. | |

OTHER PUBLICATIONS

DS1961S "ikb Protected EEPROM iButton with SHA-1 Engine," Dallas Semiconductor, www.maxim-ic.com, pp. 1-36 (date: unknown).

"The I2C-Bus Specification" Version 2.1, Philips Semiconductors, pp. 1-46, (Jan. 2000).

* cited by examiner

| 103a | 103b | 103c | 103d | 103e | 103f | 103g | 103h |
|------|------|------|------|------|------|------|------|

| 0 | 0 | 1 | 1 | 0 | 0 | 1 | 0 |
|---|---|---|---|---|---|---|---|

ADDRESSING AND COMMAND PROTOCOLS FOR NON-VOLATILE MEMORIES UTILIZED IN RECORDING USAGE COUNTS

CROSS REFERENCE TO RELATED APPLICATIONS

This application is a divisional of U.S. Ser. No. 11/154,117, filed Jun. 16, 2005, the content of which is hereby incorporated by reference.

FIELD OF THE INVENTION

The present invention relates generally to non-volatile memories, and more specifically, to addressing schemes, command protocols, and electrical interfaces for non-volatile memories utilized in recording the usage of a device.

Non-volatile memory modules are commonly found in computing devices for recording the usage of components, including consumable components having a limited life span. For instance, non-volatile memory modules are common in imaging and printing devices, such as in multifunction printers, for recording the use of components such as fusers, accumulation belts, and the like, and for recording the use of consumables such as print cartridges. In imaging or printing devices, for instance, usage may be recorded based upon the number of pages printed by the device, or based upon the partial or full depletion of the print cartridges. Such usage counts are helpful in a variety of ways, including for billing purposes and in monitoring the status and/or use of consumable components.

As computing devices have advanced and become more complex, the number of non-volatile memory modules included within each device has increased. The speed with which each non-volatile memory module must be updated or read in a computing device has also increased. Continuing with the illustrative example of printing and imaging devices, the speed and page rates of these devices are constantly improving. Therefore, not only do the contents of a greater number of non-volatile memory modules have to be updated, but the contents of these memory modules must be updated in a shorter amount of time to keep up with the faster page rates. In imaging and printing devices, because conventional many memory modules have relatively long wait times for updating, faster page rates present difficulties in updating each of the non-volatile memories in a device in a timely manner.

In addition, non-volatile memory modules (e.g., EEPROM, NOR flash memory, NAND flash memory, etc.) in computing devices may experience degradation during operation, thereby necessitating error handling to mitigate interruption of operation of the memory modules. Further, non-volatile memory modules may be physically part of removeable and/or consumable components of a computing device, such as printer cartridges. Because such removeable and/or consumable components should be easily installed and removed by users, there is a cost premium associated with each electrical connection between the computing device and it's removeable and/or consumable component, as exists, for instance, with a printing device and a printer cartridge. By utilizing multi-level or analog level communication techniques appropriately, the number of these electrical connections can be minimized, thereby helping to increase reliability and decrease cost.

Conventional protocols do not sufficiently to handle all of these problems discussed. Thus, there remains an unsatisfied need in the industry for addressing schemes, command protocols, and electrical interfaces for quickly updating non-volatile memories, such as in non-volatile memory modules utilized in imaging and printing devices.

BRIEF SUMMARY OF THE INVENTION

The present invention overcomes the disadvantages of the prior art by providing addressing schemes, command protocols, and electrical interfaces that quickly update memory modules, such as non-volatile memory modules, in computing devices such as imaging and printing devices.

According to one embodiment of the present invention, there is disclosed a of updating memory modules. The method includes receiving, at one or more memory modules, a command transmitted from a processing device, where the command is an increment counter command operable to instruct the one or more memory modules to increment a counter within the one or more memory modules. The method also includes processing the command at the one or more memory modules.

According to one aspect of the invention, the step of processing the command includes the step of incrementing, in each of the one or more memory modules, at least one counter. According to another aspect of the invention, the step of incrementing also includes incrementing, in each of the one or more memory modules, the at least one counter by an increment value specified in the command. According to yet another aspect of the invention, the command includes memory module addresses corresponding to each of the one or more one or memory modules.

The method may also include the step of establishing a busy status signal during the processing of the command at the one or more memory modules. Furthermore, the receiving step may include receiving, at the one or more memory modules, the command from the processing device transmitted to the one or more memory modules via all asynchronous data channel.

According to another embodiment of the invention, there is disclosed an electrical interface. The electrical interface includes a conductor having a plurality of discrete voltages levels, and a plurality of memory modules, where each of the plurality of memory modules is coupled to a respective one of the plurality of the discrete voltage levels to establish unique module addresses for each of the plurality of memory modules. The electrical interface also includes a first channel for exchanging data between a processing device and at least one of the plurality of memory modules, and a second channel coupled to the processing device and the plurality of memory modules, where the second channel identifies a status of the memory modules, and where the status corresponds to a voltage level of the second channel.

According to one aspect of the invention, the status is selected from the group of statuses consisting of a busy status, an error status, and a ready status. According to another aspect of the invention, the electrical interface may also include an open-drain for controlling the voltage level of the second channel. According to yet another aspect of the invention, the first channel is operable with asynchronous modulation communications or half-duplex communications. Additionally, a single command operable on the plurality of memory modules may be transmitted by the processing device via the first channel. According to another aspect of the invention, the single command may be an increment counter command or a punch out bit field command.

According to yet another embodiment of the invention, there is disclosed a method of interfacing with one or more memories. The method includes the steps of assigning an address, through an electrical conductor, to each of a plurality of memories, and exchanging data, via a first channel, between a processing device and at least one of the plurality of memories. The method also includes the steps of receiving a status of at least one memory from the at least one memory via a second channel, and providing at least one protocol for exchanging data between the processing device and the plurality of memories, where the at least one protocol is operable to address one, several, or all of the plurality of memories.

According to one aspect of the invention, the electrical conductor may include a set of discrete voltage levels for assigning the address to each of the plurality of memories. According to another aspect of the invention, the method may also include the step of assigning a counter to a location in at least one of the plurality of memories. Furthermore, the status of at least one memory may be a busy status, an error status, or a ready status. Additionally, the status may correspond to one of three voltage levels of the second channel. According to yet another aspect of the invention, the at least one protocol includes an increment counter command protocol, where the increment counter command protocol specifies an increment counter command identifying at least one of the plurality of memories, and a value by which to increment a counter in at least one of the plurality of memories. The at least one protocol may alternatively or also include a punch out bit field command protocol, where the punch out bit field command protocol specifies a punch out command identifying at least one of the plurality of memories, and a location of a bit field in at least one of the plurality of memories.

According to another embodiment of the present invention, there is disclosed a method of communicating with one or more memory modules. The method includes receiving, at a processing device, a first signal from at least one memory module, the first signal indicating that the at least one memory module is ready to receive data. The method also includes generating, at the processing device, a packet including a set of bits representing a command and a memory module address, where the memory module address utilizes singular addressing to identify each memory module. The method further includes transmitting the packet from the processing device to each identified memory module.

According to one aspect of the invention, the command includes an increment counter command, and the packet further includes an increment value. According to another aspect of the invention, the command includes a punch out bit field command. The command may also or alternatively include a write data command, where the packet includes data to be written. According to yet another aspect of the invention, the data in the packet is encrypted and the method further includes the step of decrypting the packet at each identified memory module.

According to yet another embodiment of the present invention, there is disclosed an electrical interface that uses a single conductor to deliver power for the normal operation of a plurality of memory modules and to force the modules to a known initial state, such as a reset state. According to an aspect of the invention, this may be implemented using switched power supply conductor and a power-on-reset detection circuit located in all the memory modules.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIGS. 2A and 2B are illustrative memory module addresses according to an embodiment of the present invention.

DETAILED DESCRIPTION OF THE INVENTION

Figure 1A:
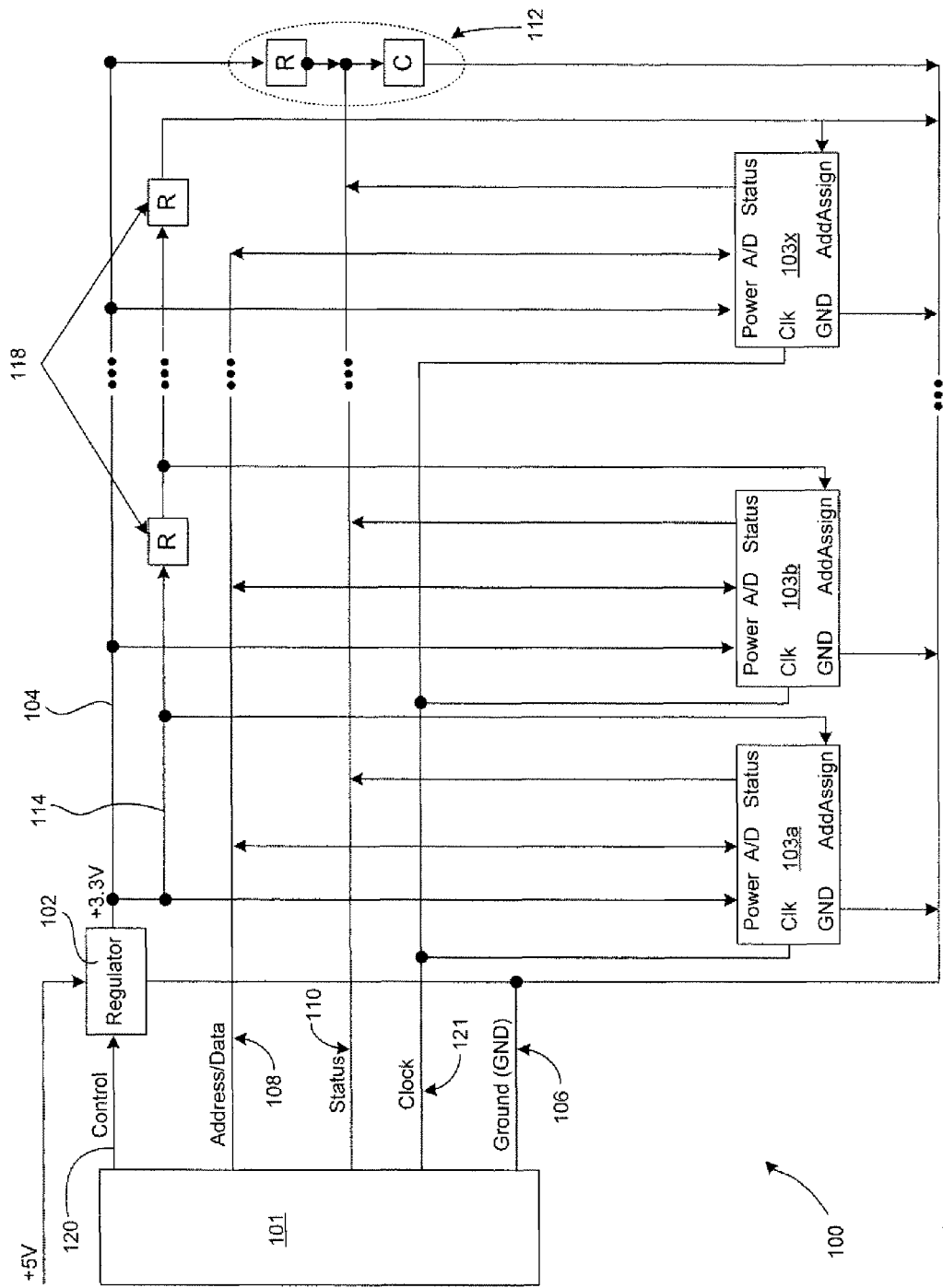
FIG. 1A is a schematic of an illustrative electrical interface, according to an embodiment of the present invention.

The present inventions now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Further, although the present invention is described in the context of addressing schemes, command protocols, and electrical interfaces for quickly updating non-volatile memories in imaging and printing devices, it will be appreciated that the present invention may be implemented in any device having non-volatile memories. This may include mobile phones, handheld computers, laptop computers, personal computers, servers, mainframe computers, personal digital assistants, and the like, and devices having minimal processing power and functionality, such as in devices with dedicated circuits for performing preprogrammed or uncomplicated tasks. In brief, the present invention may be implemented in any computing device in which the usage of components may wish to be recorded using non-volatile memory. Therefore, the embodiments herein describing non-volatile memories for tallying page counts and recording the depletion of ink in ink or toner cartridges are for illustrative purposes only and are not intended to be limiting examples.

In imaging and printing devices, page counts recorded by non-volatile memory modules ("memory modules") may be incremented as pages are printed. Page counts may include the total number of pages printed by a printer and the total number of pages printed for each of a number of print categories. Recording the number of pages for individual print categories permits the recording of page counts for specific types of printing tasks, such as the total number of color pages, monochrome pages, letter size pages, legal size pages, transparencies, etc., that may be printed. In addition to recording page counts, non-volatile memory modules may be packaged with reservoirs such as ink or toner cartridges, and the memory modules may contain one or more bit fields for recording the depletion of the reservoirs. By comparison, each bit field may be in either an erased or programmed state (e.g., a "0" or "1") while each page count may include a plurality of bits representing a numeric value. As an example, a non-volatile memory module provided with a toner cartridge may contain thirty-two bit fields, and as a particular amount of toner has been depleted (e.g., 1/32 of the total toner), a bit field may be "punched out," thereby changing the bit field from an erased state to a programmed state. For instance, the value in the bit field may be changed from an initial value of "0" to a value of "1". In this illustrative example, all thirty-two bit fields may be punched out after all of the toner had been depleted, thereby signifying full depletion of the toner cartridge. It will be appreciated by one of ordinary skill in the art that imaging and printing devices may contain non-volatile memory modules that have one or more counts, resource bit fields, or a combination thereof.

Embodiments of the present invention describe electrical interfaces, addressing schemes, and command protocols for efficiently commanding a single memory module, a group of memory modules, or all of the memory modules in an imaging or printing device. According to one aspect of the invention, each memory module in the imaging or printing device may be directed to increment one or more page counts by a specified value or to punch out a resource bit field. In order to direct a group of memory modules with a common command, the group of memory modules may be synchronized prior to issuance of the command. Further, memory modules may be able to report errors and obtain assistance in resolving those errors from a processing device. A given count or resource bit field in a non-volatile memory module may degrade with use, and therefore it may be necessary to adjust the location of the count or bit field.

I. Electrical Interface

FIG. 1A illustrates an electrical interface 100 according to an illustrative embodiment of the present invention. The interface 100 includes a processing device 101 in communication with a plurality of non-volatile memory modules 103a, 103b, . . . 103x, which may contain one or more counts, bit fields, or a combination thereof. According to one aspect of the invention, the processing device 101 may be an application-specific integrated circuit (ASIC). According to another aspect of the invention, the processing device 101 may be a general processor or microprocessor running on a computing device to execute the functions described herein. To implement the functions described herein, the processing device 101 may also include software, hardware, or a combination thereof, and may include one or more integrated components in close proximity or components that are distributed throughout an imaging and printing device.

As shown in FIG. 1A, the processing device 101 controls a voltage regulator 102 that provides a voltage source 104 to the memory modules 103a, 103b, . . . 103x. According to a preferred embodiment, the voltage source for the memory modules 103a, 103b, . . . 103x may be a common voltage source. The memory modules 103a, 103b, . . . 103x in the illustrative electrical interface 100 operate at 3.3V, but it will be appreciated by one of ordinary skill in the art that non-volatile memory modules such as the memory modules 103a, 103b, . . . 103x shown in FIG. 1 may operate at other voltages. As illustrated in FIG. 1A, the non-volatile memory modules 103a, 103b, . . . 103x are also provided with a common ground reference 106.

The processing device 101 may exchange data with one or more of the non-volatile memory modules 103a, 103b, . . . 103x through an address/data channel 108. According to one embodiment of the present invention, the address/data channel 108 may include a unidirectional first channel and a unidirectional second channel. In particular, data from the processing device 101 may be sent over the first channel to the memory modules 103a, 103b, . . . 103x using an asynchronous modulation technique and a transmission rate supported by the memory modules 103a, 103b, . . . 103x. Similarly, data may be sent from the memory modules 103a, 103b, . . . 103x to the processing device 101 over the second channel utilizing an asynchronous modulation technique and a transmission rate supported by the memory modules 103a, 103b, . . . 103x. According to one aspect of the invention, the transmission rate may be common to all of the memory modules 103a, 103b, . . . 103x. In a preferred embodiment, the transmission rates for both the first and second channels may be between approximately 38,400 bits/second and 115,200 bits/second, though the transmission rates may vary depending on the specific types of memory modules utilized. It will be appreciated that other transmission rates may also be used, including those not supported by all of the memory modules 103a, 103b, . . . 103x. For example, one memory module may transmit a response to a read command at a faster rate than another memory module.

According to other embodiments of the present invention, the address/data channel 108 may only include a single bidirectional channel capable of sending and receiving data between the processing device 101 and the memory modules 103a, 103b, . . . 103x. A single bidirectional address/data channel 108 may use an asynchronous modulation technique and a transmission rate supported by the memory modules 103a, 103b, . . . 103x. When a single bidirectional channel is used, the processing device 101 may wait before current commands in process are completed before issuing additional commands to the memory modules 103a, 103b, . . . 103x. In addition, it will be appreciated that any command requiring a response from a memory module 103a, 103b, . . . 103x may be issued over the address/data channel 108 to a single memory module 103a, 103b, . . . 103x at a time. To prevent other memory modules from utilizing the address/data channel 108 while another memory module is transmitting data, a half-duplex sharing technique or other scheduling method may be implemented. Furthermore, it will be appreciated by those of ordinary skill in the art that other alternatives for the address/data channel 108 may be possible to execute the processing device's 101 exchange data with one or more of the non-volatile memory modules 103a, 103b, . . . 103x, such as the use of two bidirectional channels, and that other transmission techniques known to those of ordinary skill in the art may be used to effect communication via the address/data channel 108.

As illustrated in FIG. 1A, the processing device 101 receives the status of the memory modules 103a, 103b, . . . 103x through a status channel 110. According to one embodiment of the present invention, the status channel 110 may include a first channel representing a busy/available status and a second channel representing an error/no-error status. In a preferred embodiment, the busy/available status may be provided on the first channel by effectively "anding" the busy/available output signals from each of the memory modules through the use of an open-collector/open-drain 112. The open-collector/open-drain 112 may include one or more common resistors and one or more capacitors. In such a configuration, each memory module 103a, 103b, . . . 103x may output a high voltage signal if it is able to accept a command, or a low voltage signal if it is busy executing a command. Thus, if all of the memory modules 103a, 103b, . . . 103x are available, then the first channel signal may be pulled up to a "high" voltage by the resistor in the open-collector/open-drain 112, signifying that all of the memory modules 103a, 103b, . . . 103x are available.

On the other hand, if any memory module 103a, 103b, ... 103x is busy, then the first channel signal may be pulled to a "low" voltage close to ground by the open-collector/open-drain 112. If at least one memory module 103a, 103b, ... 103x is busy, the processing device 101 may wait until the first channel signal is pulled to a high voltage level before issuing a subsequent command to the memory modules 103a, 103b, ... 103x. In this manner, the processing device 101 may synchronize the memory modules 103a, 103b, ... 103x before issuing a common command, such as an increment counter command, to a plurality of the memory modules 103a, 103b, ... 103x. Similarly the second channel may also effectively "and" the error/no-error output signals from each of the memory modules. This may also be provided with another open-collector/open-drain 112 having a common resistor and capacitor.

Each of the memory modules 103a, 103b, ... 103x may output a high voltage signal on the second channel when there is no error detected and a low voltage signal if an error is detected. Thus, if one of the memory modules 103a, 103b, ... 103x has an error, the second channel may be pulled to a low voltage by the open-collector/open-drain 112, signifying that at least one memory module 103a, 103b, ... 103x contains an error. If all of the memory modules 103a, 103b, ... 103x are error-free, then the second channel may be pulled to a high voltage. All of the memory modules 103a, 103b, ... 103x will be ready and error-free if the first and second channels are at a high voltage level. It will be appreciated by one of ordinary skill that there are many alternatives to the "anding" function of open-collector/open drain 112 discussed above. For example, a plurality of physical "and" gates can be used instead of the open-collector/open-drain 112.

According to another embodiment of the present invention, the status channel 110 may include only a single channel capable of representing the ready, error, and busy states for the memory modules 103a, 103b, ... 103x. When only a single channel is used, all addressed memory modules 103a, 103b, ... 103x may release their respective busy signals from a low voltage level to a high voltage level after each finishes processing its current command. The status channel 110 may then be pulled to a high voltage level by the open-drain/open-collector 112. Once the addressed memory modules 103a, 103b, ... 103x have completed their commands and released each of their output signals above the low voltage, any memory module that needs to report an error may hold the status channel 110 at an intermediate voltage level that is higher than the low voltage level (e.g., close to ground) but lower than the high voltage (e.g., approximately 3.3V). For instance, each of the memory modules 103a, 103b, ... 103x may use a 1.5V zeener diode component to ground to provide the intermediate voltage level. Other methods of providing an intermediate voltage levels may alternatively be implementing using resistors, as is known in the art, such as using a 5.1K.OMEGA. resistance to ground to provide the intermediate voltage level. In this way, a single status channel 110 may be sufficient for reporting the ready, error, and busy states of the memory modules 103a, 103b, ... 103x thereby reducing the electrical connections required between the processing device 101 and the memory modules 103a, 103b, ... 103x.

It will be appreciated by one of ordinary skill in the art that the low, high, and intermediate voltage levels do not have to correspond to the busy, error, and ready status, respectively, of the memory modules 103a, 103b, ... 103x. According to an alternative embodiment, the low voltage level may correspond to a ready status while a high voltage level may correspond to a busy level. According to another embodiment, the address/data channel 108 may be utilized to transmit the status of one or more of the memory modules 103a, 103b, ... 103x to the processing device 101. For example, the processing device may wait to receive a ready status from each of the memory modules 103a, 103b ... 103x on the address/data channel 108 before issuing a subsequent command.

As illustrated in FIG. 1A, the controlling computer system 101 may also provide a common time reference to the memory modules 103a, 103b, ... 103x through a clock channel 121. According to one embodiment of the present invention, the clock channel 121 may operate at a frequency directly correlated to the bit rate of the Address/Data channel 108 or may operate at a frequency unrelated to this bit rate. Phase-locked-loop circuits present in each memory module 103a, 103b, ... 103x may use the common time reference provided by the clock channel 121. It will be appreciated by one of ordinary skill in the art that the clock channel 121 may either be a fixed frequency or a modulated frequency to spread the electromagnetic emissions associated with the clock channel 121 over a wider frequency range.

Figure 1B:
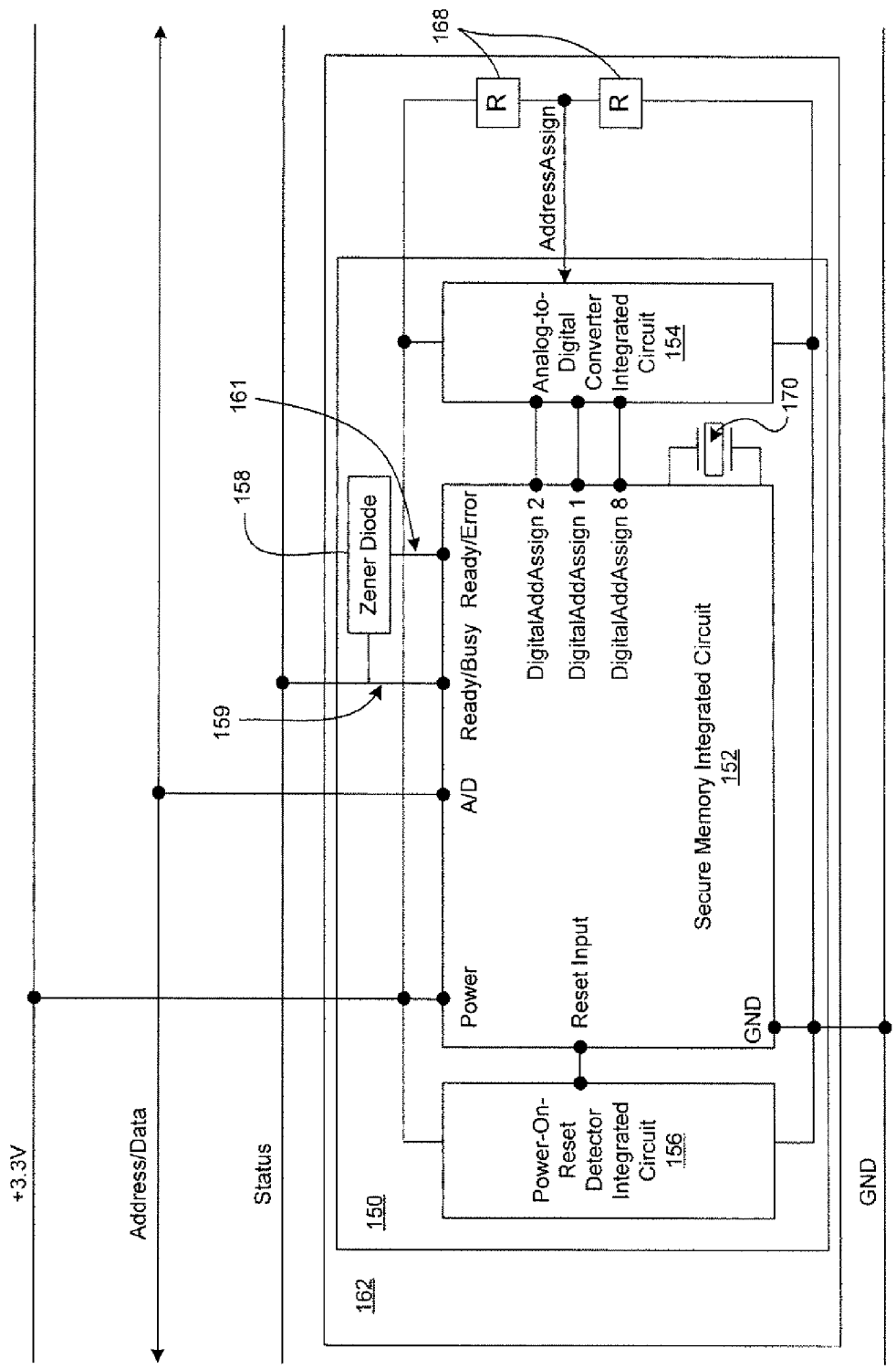
FIG. 1B is a schematic of an alternative manner by which the electrical interface of FIG. 1A may be achieved by an electronic assembly including integrated circuits, according to an illustrative embodiment of the present invention.

FIG. 1B is a schematic showing an alternative manner by which the memory modules 103a, 103b, ... 103x in the illustrative electrical interface of FIG. 1A may be achieved via an electronic assembly 162 including several integrated circuits, according to an illustrative embodiment of the present invention. More specifically, in FIG. 1B an electronic assembly 162 includes a memory module 150 that includes a Power-On Reset Detector Integrated Circuit (IC) 156, a Secure Memory IC 152, and an Analog-to-Digital (A/D) Converter IC 154. Each of the ICs 152, 154, 156 act in concert to implement the memory modules 150 described above with respect to FIG. 1. Thus, the memory module 150 implemented by a single electronic assembly 162 of FIG. 1B is equivalent to the multiple memory modules 103a, 103b, ... 103x discussed above with respect to FIG. 1A. To enable a single electrical connection to the memory module 150 to carry complete memory module 150 status (i.e., ready/busy/error) information, FIG. 1B illustrates the use of conventional open collector output circuits 159, 161 from the secure memory IC 152 and a zeener diode 158. Other arrangements for carrying status information, including those described above with respect to FIG. 1A, may also be used, as will be appreciated by those of ordinary skill in the art. The crystal 170 can provide a precision time reference that performs a similar function as that of the clock channel 121 described with respect to FIG. 1A. Other arrangements for carrying status information, including those described above with respect to FIG. 1A, may also be used, as will be appreciated by those of ordinary skill in the art. FIG. 1B also illustrates the use of a resistor divider circuit 160 to generate the specific voltage required to assign the memory module 150 a desired address. Therefore, it will be appreciated that the remainder of the specification is discussed with respect to the embodiment described in FIG. 1A, that alternative embodiments in which memory modules are implemented with one or more ICs are also within the scope of the invention described herein.

Figure 1C:
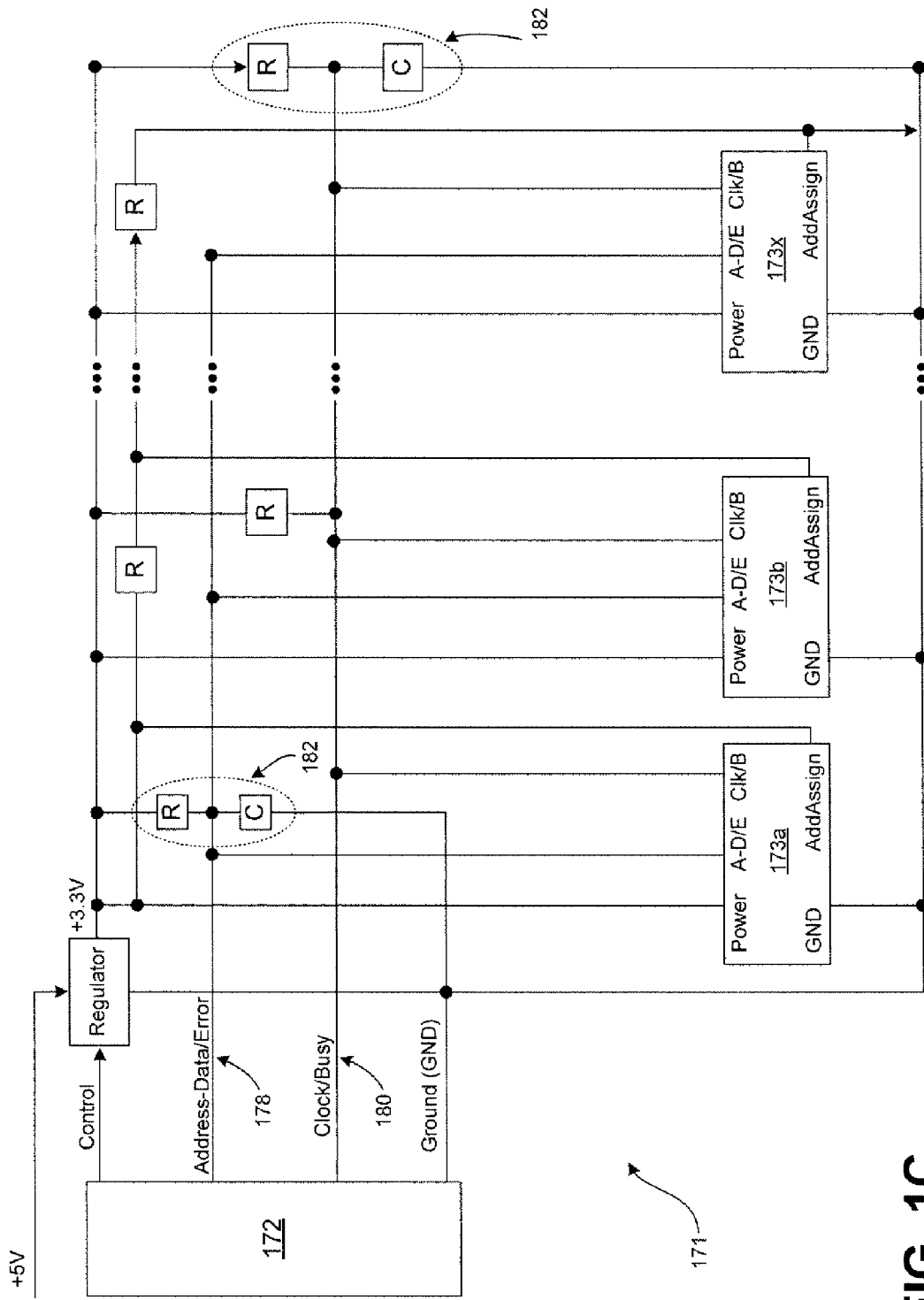
FIG. 1C is a schematic of an illustrative electrical interface, according to an embodiment of the present invention.

FIG. 1C shows another electrical interface 171 according to an illustrative embodiment of the present invention. The interface 171 includes a controlling computer system 172 in communication with a plurality of non-volatile memory modules 173a, 173b, ... 173x, which implement the basic functions as the embodiments described with respect to FIGS. 1A and 1B. It will be appreciated that in the embodiments shown in FIGS. 1A and 1B, support for a common time reference is implemented either by a clock channel 121 or by a crystal circuit 170, which can increase the number of connections between the controlling computer system 101 and the memory modules 103a, 103, . . . 103x or the incorporation of additional components into the memory modules 103a, 103b, . . . 103x, respectively. The electrical interface 171 illustrated in FIG. 1C encodes a binary clock with values 0 and 1, binary data transmission values of 0 and 1 along with busy status and error status information on two open drain, three-level channels. These channels are the Address-Data/Error channel 178 and the Clock/Busy channel 180.

When the Address-Data/Error 178 channel is at a low voltage it encodes a logical 0 data transmission state independent of whether any of the memory modules 173a, 173b, . . . 173x, are reporting an error condition. When the Address-Data/Error 178 is at an intermediate voltage level it encodes a logical 1 data transmission state and that at least one of the memory modules 173a, 173b, . . . 173x are reporting an error condition. When the Address-Data/Error 178 is at a high voltage level it encodes a logical 1 data transmission state and that none of the memory modules 173a, 173b, . . . 173x are reporting an error state. The clamping of the maximum voltage to the intermediate level, as opposed to the high voltage determined by the pull-up resistor and capacitor combinations 182 alone, can be achieved by the memory modules 173a, 173b, . . . 173x reporting an error state shorting the Address-Data/Error 178 to ground through a zeener diode or similar component known in the art to limit the maximum voltage. When the Clock/Busy channel 180 is at a low voltage it encodes a logical 0 clock state independent of whether any of the memory modules 173a, 173b, . . . 173x, are reporting a busy condition. When the Clock/Busy channel 180 is at an intermediate voltage level it encodes a logical 1 clock state and that at least one of the memory modules 173a, 173b, . . . 173x are reporting a busy condition. When the Clock/Busy channel 180 is at a high voltage level it encodes a logical 1 clock state and that none of the memory modules 173a, 173b, . . . 173x are reporting a busy state. The clamping of the maximum voltage to the intermediate level, as opposed to the high voltage determined by the pull-up resistor and capacitor combinations 182 alone is achieved by the memory modules 173a, 173b, . . . 173x reporting an error state shorting the Clock/Busy channel 180 to ground through a zeener diode or similar component so as to limit the maximum voltage.

II. Addressing Memory Modules

In order for a processing device to send commands and receive responses from a set of non-volatile memory modules distributed throughout a printing or imaging device, each of the memory modules are first assigned a memory module address according to an addressing scheme. Referring again to FIG. 1A, according to one aspect of the addressing scheme, the processing device 101 is capable of specifying a single memory module and an address or addresses location within the memory module that is to be read or modified. According to another aspect of the addressing scheme, an individual, multiple, or all of the memory modules may be issued the same command at the same time. This allows a plurality of memory modules to be updated in parallel.

A variety of methods are possible for an addressing scheme. According to one embodiment, a singular addressing scheme may be applied to the memory modules. With a singular addressing scheme, a specified number of bits in a communications protocol are allocated for the "memory module address." As necessary, each of the bits (or at least a portion thereof) in the memory module address corresponds to a particular memory module. For example, as shown in FIG. 2A, if eight bits are allocated for the memory module address, and there are eight memory modules 103a, 103b, . . . 103h, each memory module may be assigned to one of the eight bits in the memory module address 200. Each of the memory modules 103a, 103b, . . . 103h will understand that it is being addressed when its corresponding bit in the memory module address 200 is at a specific state (e.g., high or a "1"). By setting a plurality of bits in the memory module address 200, the corresponding plurality of memory modules may be addressed simultaneously by the processing device 101. For instance, if memory modules 103c, 103d, and 103g are to be addressed at the same time, then the illustrative memory module address 202 shown in FIG. 2B may be utilized.

A method by which memory modules are assigned an address under the singular addressing scheme will now be described in more detail. Many variations of address assignments are possible with commands or software activity. However, it is also possible to assign an address to a memory module without the use of issued commands or software. One embodiment is shown in FIG. 1A, in which a conductor 114 with a set of discrete voltage levels is provided through the use of resistors 118, and where each discrete voltage level corresponds to a particular bit position in the memory module address. Each of the plurality of memory modules 103a, 103b, . . . 103x will be in communication with the conductor 114, and will be assigned a memory module address based on the discrete voltage level of the conductor 114. For example, the discrete voltages of 3.3V may be provided for memory module 103a while a discrete voltage of 3.0V may be provided for memory module 103b. In this example, memory module 103a may be assigned the first bit position in the memory module address and memory module 103b may be assigned to the next bit position adjacent to the first bit position. The use of a single conductor 114 to assign addresses also reduces the number of connections required for implementing the addressing scheme, and simplifies the connections needed for memory modules packaged on removable components such as print cartridges.

According to an alternative embodiment, separate conductors, each with a discrete voltage, could be utilized with each of the memory modules 103a, 103b, . . . 103x. In yet another alternative embodiment, the specific address of a memory module may be assigned by a resistor divider circuit designed to produce a specific voltage level based upon the specific component of the imaging device. This would allow the reduction of another connection between the processing device 101 and the memory modules 103a, 103b, . . . 103x. In addition, according to another alternative embodiment, the address/data channel 108 could be utilized to program an address for each of the memory modules 103a, 103b, . . . 103x. According to yet another alternative embodiment of the present invention, the addresses of each of the memory modules 103a, 103b, . . . 103x may be pre-defined prior to its inclusion within the electrical interface 100.

Further, within each memory module 103a, 103b . . . 103x, the addresses or locations that are to be read or modified may be assigned. According to one embodiment, the processing device 101 may assign the address or location by using a hardware strapping capability. As an example, the processing device 101 may provide that particular counts in each memory module 103a, 103b, . . . 103x will be assigned to a particular address or location. For example, within each memory module 103a, 103b, . . . 103x, a total page count may be assigned to one address, a number of printed color pages to a second address, a number of printed monochrome phages to a third address, a number of letter-sized printed pages to a fourth address, a number of legal-sized printed pages to a fifth address, and a number of printed transparencies to a sixth address, and so on. Further, the address or location in a memory module 103a, 103b, . . . 103x may be specified for resource usage bit fields that may be utilized in metering resource usage in print cartridges.

III. Command Protocols

Figure 3:
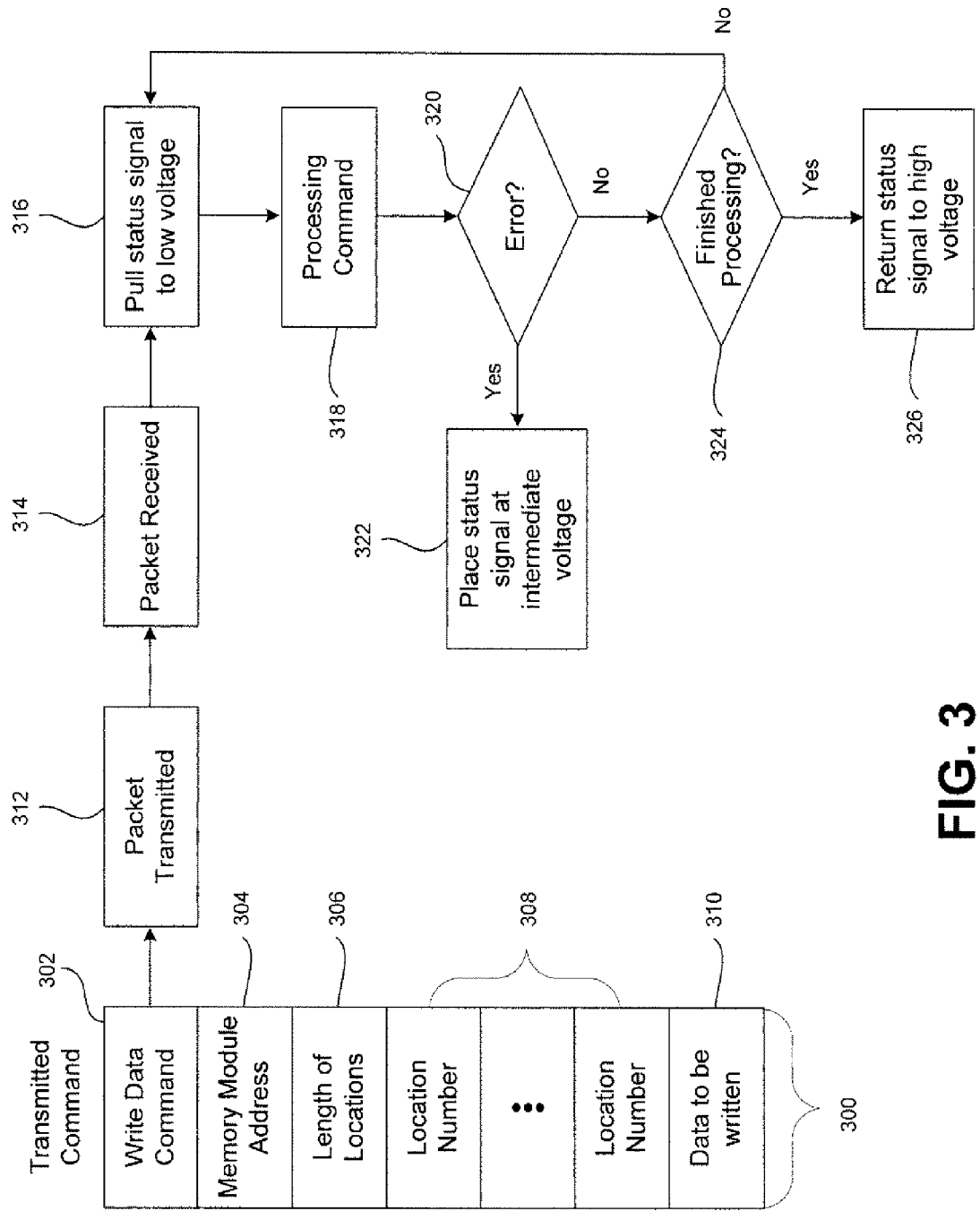
FIG. 3 is a block diagram flow chart of a write data operation, according to an illustrative embodiment of the present invention.

The command sets and protocols (also referred to as "command protocols") utilized in accordance with an embodiment of the present invention support the writing of data to and the reading of data from one or more memory modules 103a, 103b, . . . 103x. FIG. 3 is a block diagram flow chart of an exemplary write data command protocol that allows a specified value to be written to one or more locations in one or more memory modules 103a, 103b, . . . 103x. As shown in FIG. 3, the write data command protocol 300 includes sets of bits representing the write data command 302, the memory module address 304, the length of the list of locations 306, the corresponding locations 308, and the data to be written 310. The write data command 302 may be, for instance, an eight bit field representing the "write data" command. The memory module address 304 may, for instance, a sixteen bit field utilizing singular addressing to indicate which of a potential sixteen memory modules 103a, 103b, . . . 103x the command 302 is addressed to. As indicated above with singular addressing, one memory module, a set of memory modules, or all of the memory modules 103a, 103b, . . . 103x may be addressed simultaneously by setting each of the respective bits in the memory module address to a "1". The length of the locations 306, perhaps an eight bit field, may indicate how many locations within each memory module 103a, 103b, . . . 103x are to be updated. Each of the location numbers 308 may be for instance, a sixteen bit field indicating the address of the location in the memory module 103a, 103b, . . . 103x that is to be updated. As an example, if four separate locations are to be updated, then the length of the list of locations 306 will be four, and there may be four separate sixteen-bit location numbers 308 specified. The data to be written 310 represents the specified data that is to be written in each of the locations 306.

Once the write data command protocol 300 is prepared, it is transmitted to each of the memory modules 103a, 103b, . . . 103x (blocks 312, 314) if the memory modules are all ready (e.g., status signal 110 at a high voltage level). If the memory module address 304 indicates that a particular memory module 103a, 103b, . . . 103x is being addressed, then each memory module 103a, 103b, . . . 103x that is being addressed pulls its status signal 110 to a low voltage to indicate a busy status (block 316) while it processes the write data command 302 (block 318). If the memory module 103a, 103b, . . . 103x encounters an error while processing the write data command 302 (block 320), its status signal 110 may be placed at an intermediate voltage level to indicate an error (block 322). Assuming no error is encountered, each addressed memory module 103a, 103b, . . . 103x will write the data value 310 to each of the locations 306. When the write data command 302 is completed (block 324), the memory module 103a, 103b, . . . 103x releases its status signal from a low voltage level to a high voltage level to signify completion of the command 302 (block 326).

In addition to the writing of specified data values to particular locations, command protocols are also supported in order to have one or more counters incremented. According to one embodiment of the invention, another command protocol of the present invention is an increment counter command protocol, which permits the memory modules to receive an increment counter command. With an increment counter command, each memory module may include a counter that maintains its own count, which is increased by a specified value upon receipt of the increment counter command. The increment counter command may be utilized with a plurality of counters with different counts—for example global page counts, color page counts, letter-sized page counts, legal-sized paged counts, transparency page counts, etc. Thus, the global page count the color page count, the letter-sized page counts, and the transparency page counts in one or more memory modules 103a, 103b, . . . 103x may be incremented at the same time, which makes it unnecessary for the processing device 101 to know of the present values of each of those counts that are being updated. Instead, each memory module 103a, 103b, . . . 103x is responsible for maintaining its own counts and updating the counts upon receipt of the increment counter command protocol.

Figure 4:
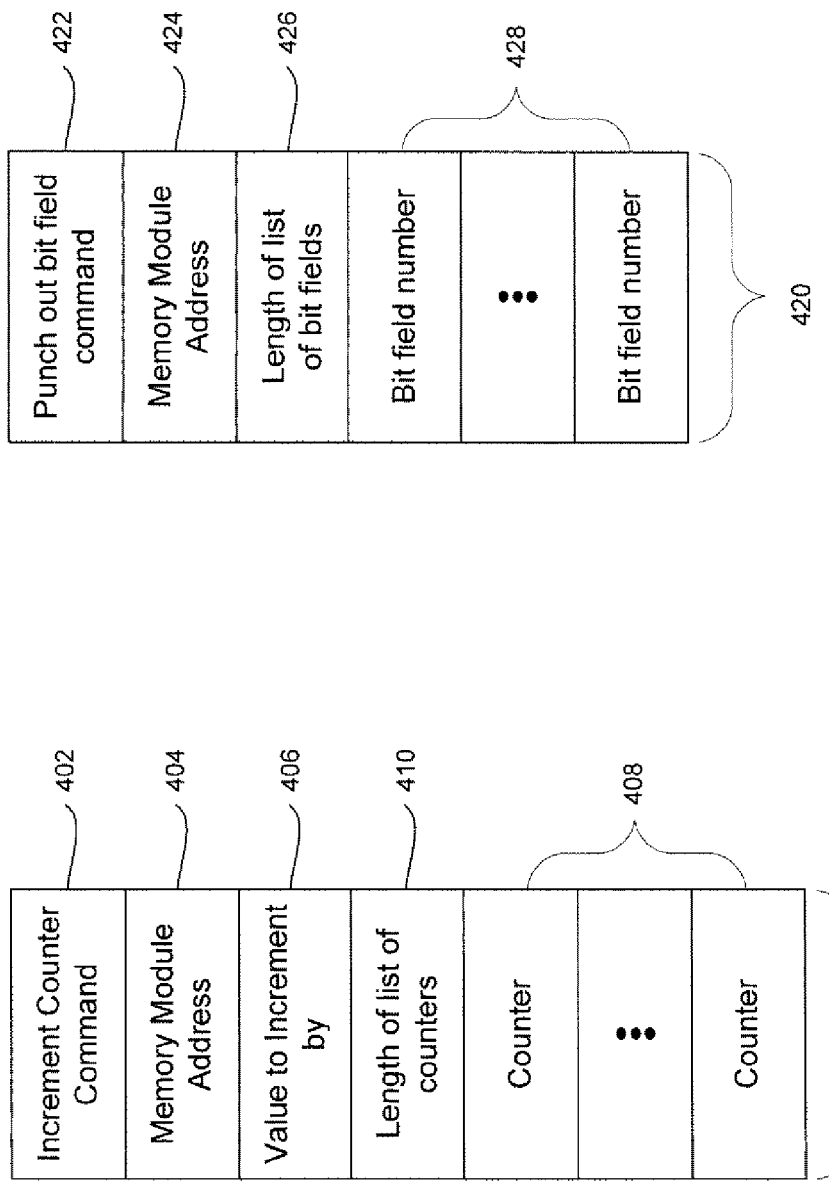
FIGS. 4A and 4B are illustrative command protocols, according to an embodiment of the present invention.

As shown in FIG. 4A, similar to the write data command protocol 300, the increment counter protocol 400 includes a set of bits allocated for the increment counter command 402, the memory module address 404, the value that each counter will increment by 406, the length of the list of counters 408, and the address of each counter to increment within the memory module 410. According to one illustrative example, the increment counter command 402 may be eight bits, the memory module address 404 may be sixteen bits, the value that each counter will increment by 406 may be eight bits, the length of the list of counters 408 may be eight bits, and the address of each counter 410 may be sixteen bits. Each memory module 103a, 103b, . . . 103x that is addressed will pull the signal on the status channel 110 to a low voltage to signify that it is busy while it updates one or more counters by the value specified. The memory module 103a, 103b, . . . 103x will release the signal on the status channel 110 to a high voltage to signify that it is ready after each addressed counter has been updated.

Referring next to FIG. 4B, the protocol 420 for commands to punch out a resource bit field is shown, according to one embodiment of the invention. The punch out protocol 420 includes a plurality of bits allocated for the punch out bit field command 422, the memory module address 424, the length of list of bit-field numbers to address 426, and the address of each bit field number in the memory module 428. According to one illustrative embodiment, the punch out bit field command 422 may be eight bits, the memory module address 424 may be sixteen bits, the length of the list of bit-field numbers 426 may be eight bits, and the address of each bit field number 428 may be sixteen bits. No data value needs to be specified because the punch out bit field command 422 does not require that a memory module 103a, 103b, . . . 103x update a particular value, but only to punch out a particular bit field (e.g., changed from an erased state to a programmed stated).

Figure 5:
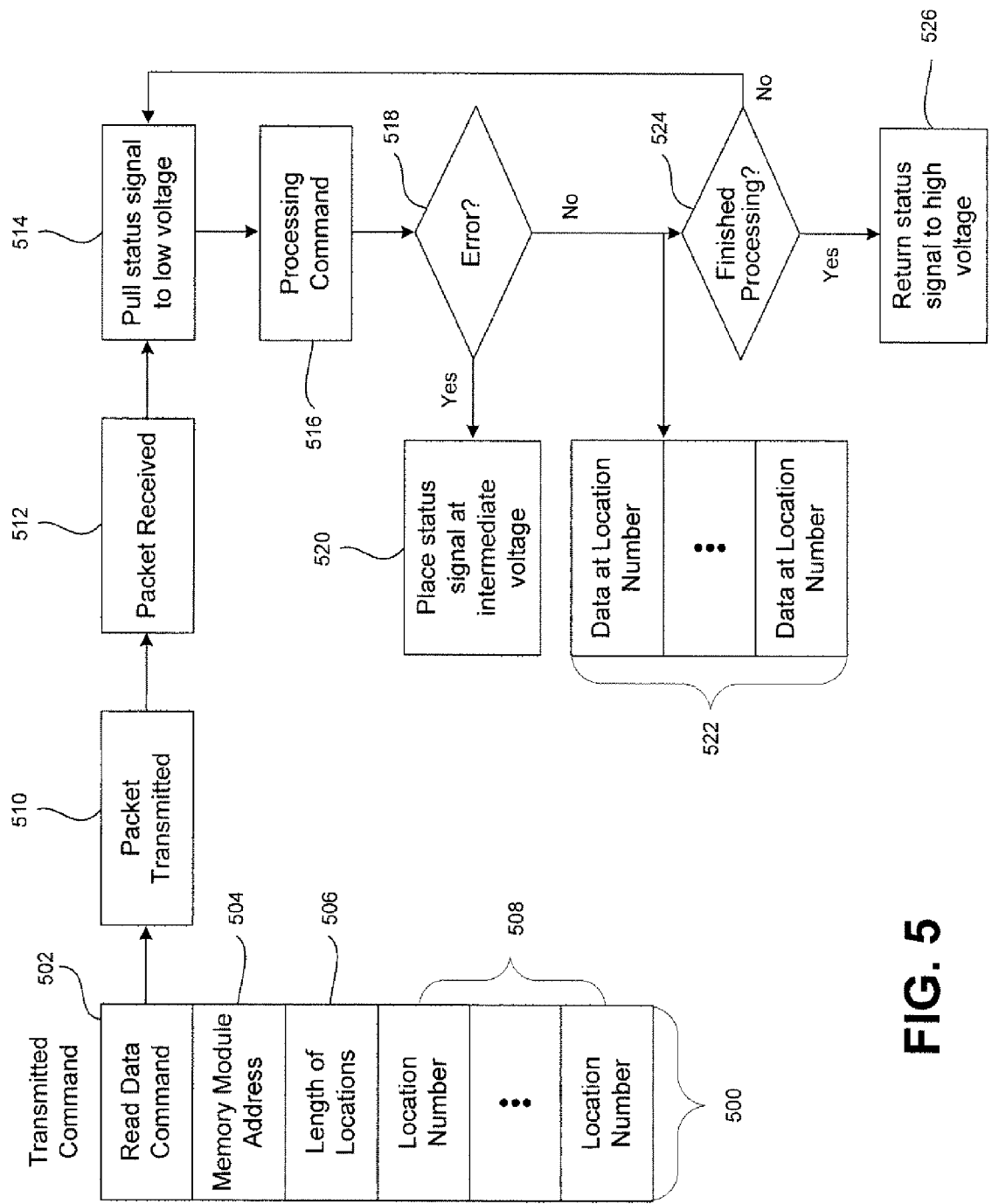
FIG. 5 is a block diagram flow chart of a read data operation, according to an illustrative embodiment of the present invention.

FIG. 5 is block diagram flow chart of an exemplary read data command protocol that allows the processing device 101 to query a particular memory module 103a, 103b, . . . 103x for a stored value. The read data command protocol 500 differs from the write command protocols above in that the addressed memory module 103a, 103b, . . . 103x sends data 522 back to the processing device 101. Referring to FIG. 5, the read data command protocol 500 includes sets of bits representing the read data command 502, the memory module address 504, the length of the list of locations 506, and the corresponding locations 508. For example, the command 502 may consist of an eight bit long command representing the "read" data command for a memory module 103a, 103b, . . . 103x. The memory module address 504 may be a sixteen bit field utilizing singular addressing to indicate which of the potential sixteen memory modules 103a, 103b, . . . 103x the command is addressed to. The length of the list of locations 506, perhaps an eight bit field, will indicate how many locations within each memory module 103a, 103b, . . . 103x are to be read. Each of the location numbers 508 may be perhaps a sixteen bit field indicating the address of the location in the memory module 103a, 103b, . . . 103x that is to be read.

Once the read data command protocol 500 is prepared, it is transmitted to each of the memory modules 103a, 103b, . . . 103x (blocks 510 and 512) assuming that the memory modules 103a, 103b, . . . 103x are ready (e.g., the status signal 110 is at a high voltage). If the memory module address 504 indicates that a particular memory module 103a, 103b, . . . 103x is being addressed, then the memory module 103a, 103b, . . . 103x that is being addressed pulls its status signal 110 to a low voltage to signify a busy status (block 514) while it processes the read data command 502 (block 516). If the memory module 103a, 103b, . . . 103x encounters an error while processing the read data command 502, then its status signal 110 may be pulled to an intermediate voltage level to signify an error status (block 520). Assuming no error is encountered, data 522 retrieved from the requested location numbers will be sent to the processing device 101. Once the write command has been completed (block 524), the memory module releases its signal on the status channel 110 from a low voltage level to a high voltage level (block 526).

Figure 6B:
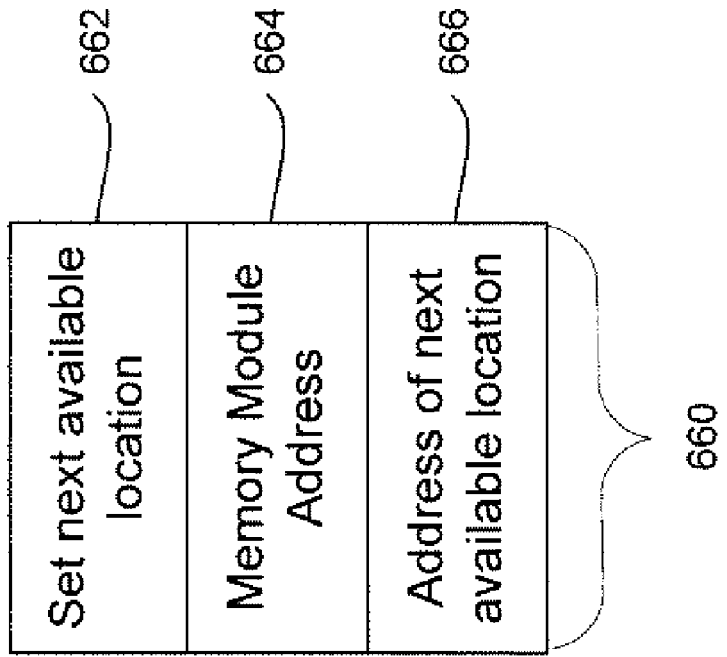
FIGS. 6A and 6B are illustrative command protocols according, to an embodiment of the present invention.
Figure 6A:
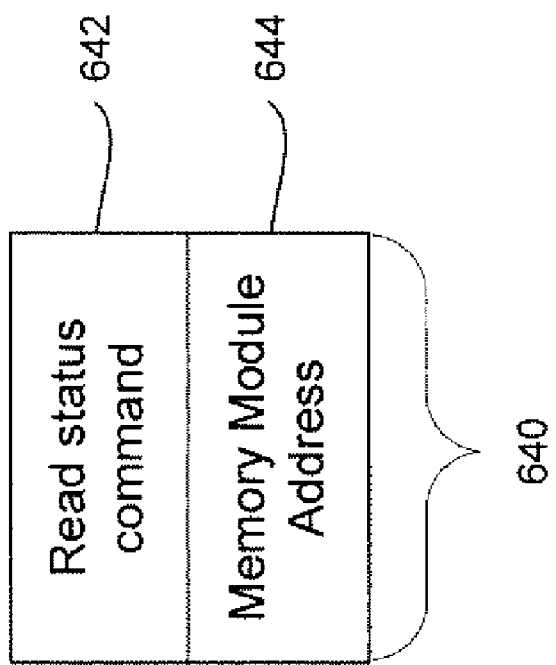

Because the memory modules 103a, 103b . . . 103x may sometimes report errors by holding the status channel 110 at an intermediate voltage level, a command protocol to read the status of the memory modules is needed. When the processing device 101 detects that an error has occurred, it may individually query each of the memory modules 103a, 103b, . . . 103x with a "read status" command 642. As illustrated in FIG. 6A, this protocol 640 may include a set of bits representing the read status command 642 and the memory module address 644. The read status command 642 may be, for instance, eight bits and the memory module address 644 may be sixteen bits. After processing the read status command 642, the addressed memory module 103a, 103b, . . . 103x may then respond with its current status and return its status channel 110 to the Ready status (e.g., a high voltage level).

One error that a memory module 103a, 103b, . . . 103x may report is that one of its counters is not maintaining a value as expected. This may occur because particular locations in the non-volatile memory modules 103a, 103b, . . . 103x may degrade over time with use. In such a situation, the processing device 101 may send a command to set the next available location. As shown in FIG. 6B, this protocol 660 may include a set of bits representing the set next available location command 662, the memory module address 664, and the address of the next available location 666. According to an illustrative example, the set next available location 662 may be eight bits, the memory module address 664 may be sixteen bits, and the address of the next available location 666 may be sixteen bits. In an alternative embodiment of the present invention, the set next available location command protocol 660 may not be necessary if each memory module 103a, 103b, . . . 103x is able to automatically remap a counter or bit field to a new address or location without assistance from the processing device 101. According to yet another alternative embodiment of the present invention, one or more reserved memory modules may be provided such that a faulty memory module may be remapped to one of the reserved memory modules, either automatically or with assistance from the processing device 101.

One of ordinary skill will recognize that many variations and additions to the described command protocols are possible. For example, a different number of bits may be used for the memory module addresses and for the address/locations in the command protocols. For example, eight bits or twenty-four bits may be used for the memory module address as well to accommodate fewer or more memory modules 103a, 103b, . . . 103x. In addition, the fields contained in each of the command protocols may be rearranged in other orders as well. For example, in the write data command protocol 300, the data that is to be written 310 could be placed between the memory module address 304 and the length of the locations 306. In addition, horizontal parity bits, vertical parity bits, or both may be used with the transmitted protocols for checking and resolving transmission errors. Further, for security purposes, authentication may be utilized between the memory modules 103a, 103b, . . . 103x and processing device 101. For example, in FIG. 3, the data 310 may be encrypted prior its transmission to the memory modules 103a, 103b, . . . 103x. In such a case, the memory module will be responsible for decrypting the data 310. A variety of encryption algorithms known in the art may be utilized, including an RSA encryption algorithm (e.g., 1024-bit, 2048-bit, etc.) that utilizes asymmetrical keys (e.g., public and private keys). If encryption/decryption is utilized, then the command protocols may also support reading asymmetric keys and accepting asymmetric keys from the processing device 101 and memory modules 103a, 103b, . . . 103x. In addition, the memory modules 103a, 103b, . . . 103x, including those provided with print cartridges, may include serial numbers to authenticate the manufacturer of the cartridges. Accordingly, a command protocol may be supported in order to read the serial number from the memory module. The read serial number command protocol may include a set of bits for the read serial number command and the memory module address. A memory module 103a, 103b, . . . 103x that receives the read serial number command protocol will respond with its serial number.

Figure 7:
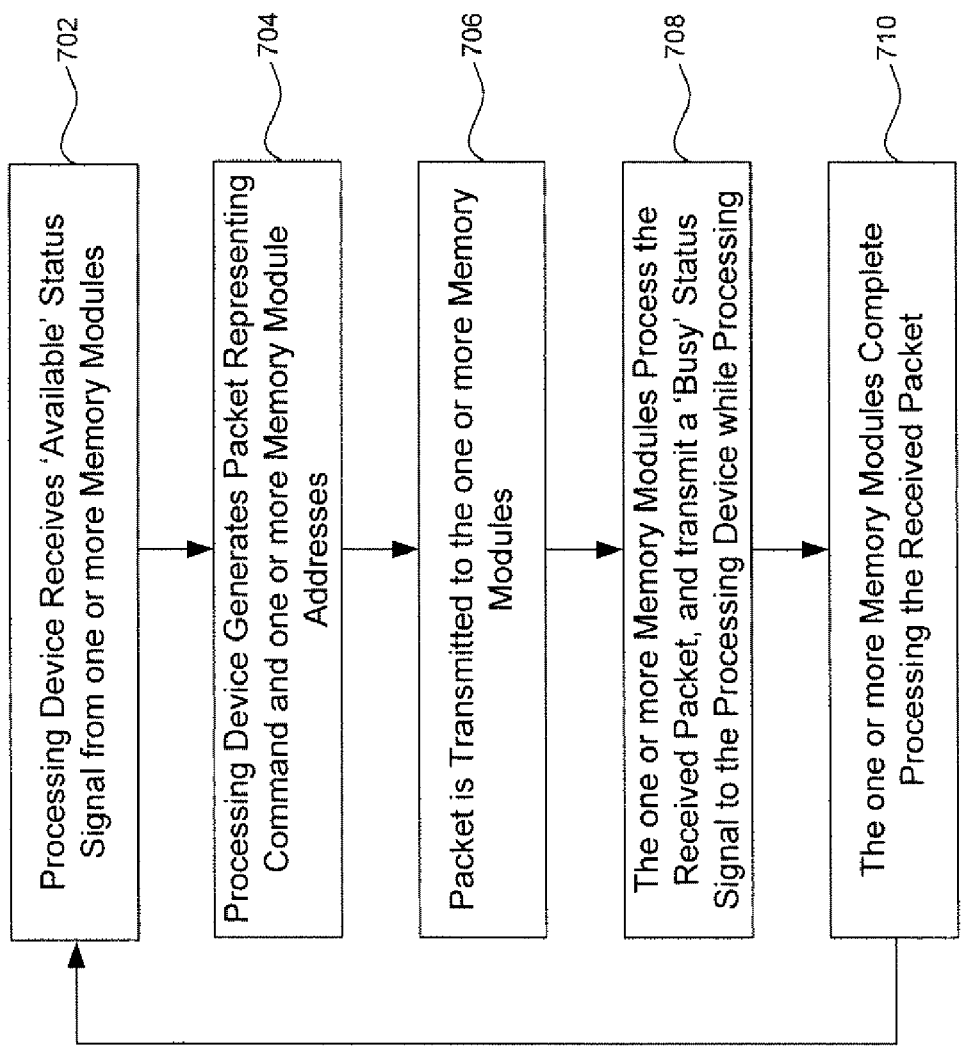
FIG. 7 shows a block diagram flow chart illustrating a method of communicating with one or more memory modules, according to one embodiment of the present invention.

FIG. 7 shows a block diagram flow chart illustrating a method of communicating with one or more memory modules, such as one or more non-volatile memory modules, according to one embodiment of the present invention. As shown in FIG. 7, the method may begin with a processing device, such as the illustrative processing device 101 of FIG. 1A, receiving a status signal from one or more memory modules (block 702) instructing the processing device that the one or more memory modules are prepared to receive data. According to one embodiment of the invention, the one or more memory modules may be one or more of the memory modules 103a, 103b, . . . 103x illustrated in FIG. 1A. The status signal may be an 'available' status signal, as described in detail above. Next, the processing device generates a packet including a command and one or more memory module addresses (block 704) to which the command will be transmitted. According to one aspect of the invention, the command is an increment counter command to increment one or more of the memory modules by an increment value also included in the command. According to other aspects of the invention, the command may include a punch out bit field command, and/or a write data command, both of which were described above. Referring again to FIG. 7, after the processing device transmits the packet to the one or more memory modules (block 706), the one or more memory modules process the received packet and transmit a 'busy' status signal to the processing device while processing the packet (block 708). After the one or more memory modules complete processing the packet (block 710), an available status signal may be sent to the processing device, which receives the status (block 702) so that additional commands may be sent to the one or more memory modules.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A method of updating memory modules, comprising:
receiving, at one or more memory modules, a command transmitted from a processing device, wherein the command comprises a) an increment counter command operable to instruct the one or more memory modules to increment a counter within the one or more memory modules and b) a punch out bit field command operable to instruct the one or more memory modules to punch out a specified bit field within the one or more memory modules; and
processing the command at the one or more memory modules.

2. The method of claim 1, wherein processing the command comprises incrementing, in each of the one or more memory modules, at least one counter.

3. The method of claim 2, wherein incrementing further comprises incrementing, in each of the one or more memory modules, the at least one counter by an increment value specified in the command.

4. The method of claim 2, wherein the command further comprises memory module addresses corresponding to each of the one or more one or memory modules.

5. The method of claim 1, further comprising establishing a busy status signal during the processing of the command at the one or more memory modules.

6. The method of claim 1, wherein receiving further comprises receiving, at the one or more memory modules, the command from the processing device transmitted to the one or more memory modules via an asynchronous data channel.

7. The method of claim 1, wherein the punch out bit field command comprises implementing a command to change a bit associated with at least one memory module from an erased state to a programmed state.

8. The method of claim 1, wherein the bit field comprises at least eight bits.

9. A method of updating memory modules, comprising:
receiving, at one or more memory modules, a command transmitted from a processing device, wherein the command is a) a punch out bit field command operable to instruct the one or more memory modules to punch out a specified bit field within the one or more memory modules and b) an increment counter command operable to instruct the one or more memory modules to increment a counter within the one or more memory modules; and
processing the command at the one or more memory modules.

10. The method of claim 9, wherein the punch out bit field command comprises implementing a command to change a bit associated with at least one memory module from an erased state to a programmed state.

11. The method of claim 9, wherein the bit field comprises at least eight bits.

12. The method of claim 9, wherein receiving further comprises receiving, at the one or more memory modules, the command from the processing device transmitted to the one or more memory modules via an asynchronous data channel.

13. The method of claim 9, wherein processing the command comprises incrementing, in each of the one or more memory modules, said counter.

14. The method of claim 9, wherein incrementing further comprises incrementing, in each of the one or more memory modules, the counter by an increment value specified in the command.

15. The method of claim 9, further comprising establishing a busy status signal during the processing of the command at the one or more memory modules.

16. A method of updating memory modules in an imaging device, comprising:
receiving, at one or more memory modules, a command transmitted from a processing device, wherein the command is indicative of usage of toner or ink in a consumable item in the imaging device and is operable to instruct the one or more memory modules to punch out a specified bit within the one or more memory modules indicative of said usage of toner or ink; and
processing the command at the one or more memory modules.

* * * * *